United States Patent
Ikuta et al.

(10) Patent No.: US 7,549,141 B2
(45) Date of Patent: Jun. 16, 2009

(54) PHOTOMASK, PHOTOMASK MANUFACTURING METHOD, AND PHOTOMASK PROCESSING DEVICE

(75) Inventors: Yoshiaki Ikuta, Guilderland, NY (US); Hiroshi Kojima, Hitachinaka (JP); Kouji Otsuka, Yokohama (JP)

(73) Assignee: Asahi Glass Company, Ltd., Tokyo (JP)

(*) Notice: Subject to any disclaimer, the term of this patent is extended or adjusted under 35 U.S.C. 154(b) by 632 days.

(21) Appl. No.: 11/222,979

(22) Filed: Sep. 12, 2005

(65) Prior Publication Data

US 2007/0059608 A1 Mar. 15, 2007

(51) Int. Cl.
G06F 17/50 (2006.01)

(52) U.S. Cl. .......................... 716/19; 716/20

(58) Field of Classification Search .................. 716/19, 716/21; 717/21; 355/52, 67, 75; 438/736
See application file for complete search history.

(56) References Cited

U.S. PATENT DOCUMENTS

| | | | |
|---|---|---|---|
| 5,445,996 A * | 8/1995 | Kodera et al. | 438/633 |
| 5,539,521 A | 7/1996 | Otokake et al. | |
| 5,995,226 A | 11/1999 | Abe et al. | |
| 6,299,506 B2 | 10/2001 | Nishimura et al. | |
| 6,885,436 B1 | 4/2005 | Berman et al. | |
| 6,888,621 B2 * | 5/2005 | Araki et al. | 355/75 |
| 2003/0133087 A1 | 7/2003 | Shima | |
| 2003/0186624 A1 * | 10/2003 | Koike et al. | 451/8 |
| 2004/0146789 A1 | 7/2004 | Itoh | |
| 2004/0192063 A1 | 9/2004 | Koike | |
| 2004/0192171 A1 * | 9/2004 | Koike | 451/5 |
| 2005/0181611 A1 * | 8/2005 | Shibano et al. | 438/689 |

FOREIGN PATENT DOCUMENTS

| | | |
|---|---|---|
| JP | 07-130647 | 5/1995 |
| JP | 08-120470 | 5/1996 |
| JP | 10-135121 | 5/1998 |
| JP | 10-154654 | 6/1998 |
| JP | 10-286771 | 10/1998 |
| JP | 10-329012 | 12/1998 |
| JP | 10-337638 | 12/1998 |

(Continued)

OTHER PUBLICATIONS

Aric Shorey, et al., "Magnetorheological Finishing of large and lightweight optics", QED Technologies, 1040 University Avenue, Rochester, NY 14607 USA, Proceedings of SPIE vol. 5533, pp. 99-107.

(Continued)

Primary Examiner—Sun J Lin
(74) Attorney, Agent, or Firm—Oblon, Spivak, McClelland, Maier & Neustadt, P.C.

(57) ABSTRACT

A photomask is manufactured by a method including providing a substrate having a surface on which a predetermined pattern is to be formed, positioning the substrate in an exposure tool so as to obtain an amount of deformation of the surface due to an external force imposed on the substrate, calculating a target profile of the surface, based on the amount of deformation and a target flatness of the surface, and processing the surface of the substrate so as to make the surface substantially flat when the substrate is positioned in the exposure tool.

17 Claims, 7 Drawing Sheets

FOREIGN PATENT DOCUMENTS

| | | |
|---|---|---|
| JP | 11-194479 | 7/1999 |
| JP | 11-195595 | 7/1999 |
| JP | 2000055641 A * | 2/2000 |
| JP | 2000-038189 | 3/2000 |
| JP | 2000-286191 | 10/2000 |
| JP | 2001-023886 | 1/2001 |

OTHER PUBLICATIONS

"International Technology Roadmap for Semiconductors", 2003 Edition, Lithography.

* cited by examiner

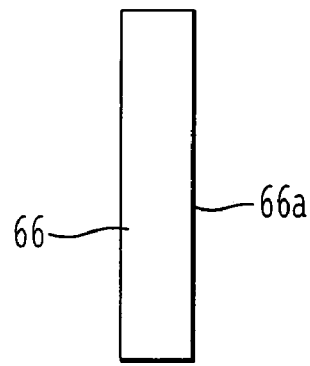
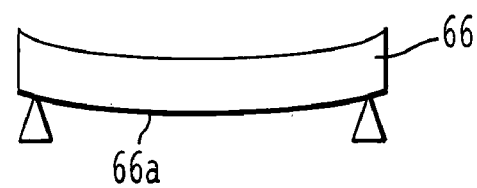
*FIG. 2(a)*
BACKGROUND ART
*FIG. 2(b)*
BACKGROUND ART
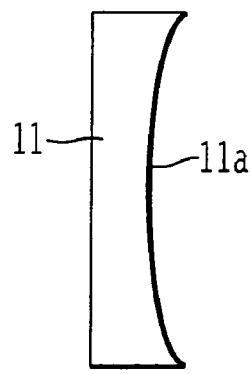
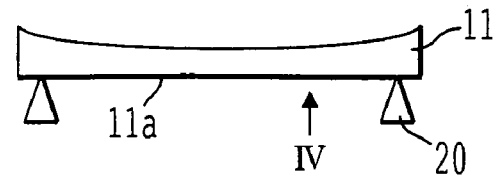
*FIG. 3(a)*
*FIG. 3(b)*

PHOTOMASK, PHOTOMASK MANUFACTURING METHOD, AND PHOTOMASK PROCESSING DEVICE

BACKGROUND OF THE INVENTION

1. Field of the Invention

The present invention relates to a photomask, a method of manufacturing the photomask and a photomask processing device.

2. Discussion of the Background

Lithography has been a powerful technique for forming a highly-integrated circuit pattern on a semiconductor wafer. In this technique, a photomask having the original circuit pattern is illuminated with an exposure light, and the circuit pattern is transferred to the photoresist film coated on the wafer. The transferred image is desired to have a high resolution and contrast so as to form a fine, precise circuit pattern on the semiconductor wafer. However, the photomask can be deformed by heat or other causes, and the image obtained by such a deformed photomask may have a reduced contrast and an undesirable pattern. Therefore, various methods have been proposed and attempted to suppress such a photomask deformation.

For example, Japanese Unexamined Patent Publication 10-135121 discloses an exposure tool having a mask holder which is made of material having the same coefficient of thermal expansion as that of the photomask. The mask holder is also designed to hold the photomask by air suction through the suction holes provided on the surface of the mask holder.

Japanese Unexamined Patent Publication 11-195595 discloses an exposure tool in which the photomask is held vertically in the attempt to prevent from the deformation of the patterned surface of the photomask due to the influence of gravity.

Furthermore, Japanese Unexamined Patent Publication 11-194479 discloses a method of manufacturing a photomask in which the mask blank having flat surfaces is held so that the surface for the pattern formation faces upward and is curved in a convex form, and on this convex surface a circuit pattern is formed. The photomask having the pattern is then placed horizontally in the exposure tool with the patterned surface facing downward, and thus the surface of the substrate is deformed in a convex form due to the gravity effect. In order to compensate for this deformation of the surface, according to this method, the circuit pattern is provided on the convex-curved surface of the substrate.

The contents of the Japanese Unexamined Patent Publications 10-135121, 11-195595 and 11-194479 are incorporated herein by reference in their entirety.

SUMMARY OF THE INVENTION

According to one aspect of the present invention, a method of manufacturing a photomask substrate includes providing a substrate having a surface including a portion on which a predetermined pattern is to be formed and a peripheral portion outside the portion, disposing the substrate in a substantially horizontal position, the substrate having the surface facing downward and being supported at the peripheral portion, determining an amount of deformation of the surface caused by an external force, calculating a target surface profile of the surface, based on the amount of the deformation and a target flatness of the surface of the substrate being disposed in the substantially horizontal position, and removing a surface portion of the substrate so as to obtain the target surface profile.

According to another aspect of the present invention, a method of manufacturing a photomask substrate includes providing a substrate having a surface on which a predetermined pattern is to be formed, positioning the substrate in an exposure tool so as to obtain an amount of deformation of the surface due to an external force imposed on the substrate, calculating a target profile of the surface, based on the amount of deformation and a target flatness of the surface, and processing the surface of the substrate so as to make the surface substantially flat when the substrate is positioned in the exposure tool.

According to yet another aspect of the present invention, a photomask substrate has a surface having a portion on which a predetermined pattern is to be formed and a peripheral portion outside the portion, the surface being a curved surface formed by removing a surface portion of the substrate to obtain a target surface profile, the target surface profile being calculated based on a flatness of the surface measured when the substrate is disposed in a substantially horizontal position and supported at the peripheral portion, and the surface faces downward.

According to still yet another aspect of the present invention, a photomask substrate processing device includes a surface analyzer configured to measure a flatness of a surface of a substrate, the surface including a portion on which a predetermined pattern is to be formed and a peripheral portion outside the portion, the substrate being disposed in a substantially horizontal position and supported at the peripheral portion, and having the surface facing downward, a calculation unit configured to calculate a target surface profile of the surface of the substrate based on the flatness measured by the surface analyzer, a surface processor configured to process the surface so as to remove a surface portion of the substrate, and a process controller configured to control the surface processor to remove the surface portion so as to obtain the target surface profile calculated by the calculation unit.

According to still another aspect of the present invention, there is provided a computer readable media for controlling a computer to perform providing a substrate having a surface including a portion on which a predetermined pattern is to be formed and a peripheral portion outside the portion, disposing the substrate in a substantially horizontal position, the substrate having the surface facing downward and being supported at the peripheral portion, measuring a flatness of the surface of the substrate being disposed in the substantially horizontal position, calculating a deformation amount and a desired surface profile of a surface portion of the substrate based on the flatness, and processing the surface so as to remove the surface portion of the substrate and obtain the desired surface profile.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(a) is a schematic side view of a photomask having substantially flat surfaces;

FIG. 2(b) is a schematic side view of the photomask of FIG. 2(a) disposed in a substantially horizontal position;

FIG. 3(a) is a schematic side view of a photomask according to one embodiment of the present invention;

FIG. 3(b) is a schematic side view of the photomask of FIG. 3(a) disposed in a substantially horizontal position;

DESCRIPTION OF THE EMBODIMENTS

Figure 1:
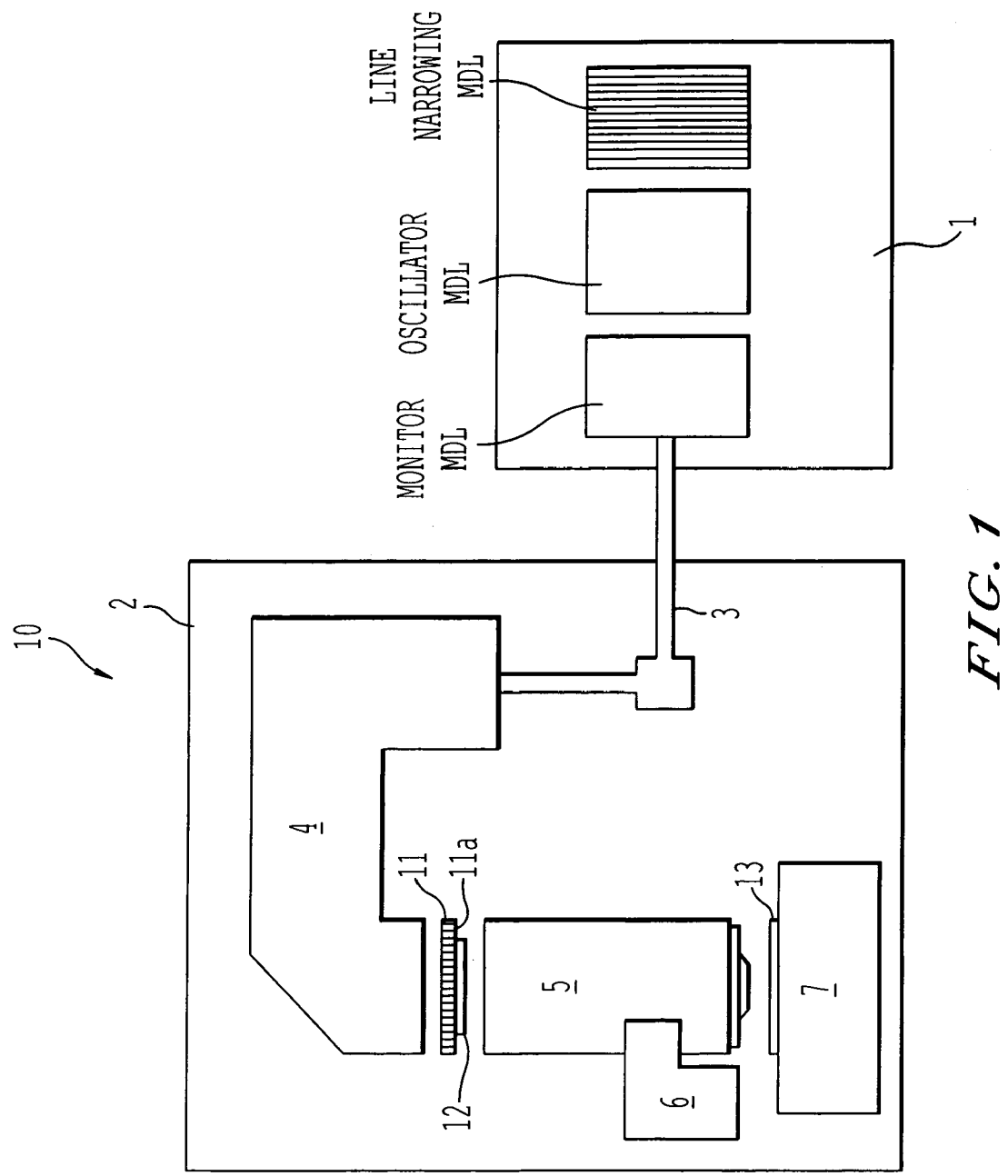
FIG. 1 is a schematic illustration of an exposure tool for lithography.

The embodiments will now be described with reference to the accompanying drawings, wherein like reference numerals designate corresponding or identical elements throughout the various drawings.

FIG. 1 is a schematic illustration showing a structure of an exposure tool utilized in lithography. An exposure tool 10 includes a light source 1 and a stepper/scanner 2, and the stepper/scanner 2 includes delivery optics 3, illumination optics 4, projection optics 5, alignment optics 6 and a wafer stage 7. Inside the stepper/scanner 2, a photomask 11 having the original circuit pattern to be transferred to a photoresist film on a wafer 13 is placed as shown in FIG. 1. The wafer 13 is disposed on the wafer stage 7 at a desired position by using the alignment optics 6. The light source 1 is configured to produce light with a predetermined wavelength such as 365 nm (i line), 248 nm (KrF excimer laser), 193 nm (ArF excimer laser) and 157 nm ($F_2$ laser). As an example the light source 1 of FIG. 1 is provided with a line narrowing module (MDL), an oscillator module, and a monitor module. The light produced from the light source 1 is guided through the delivery optics 3 and illumination optics 4, and uniformly illuminates the photomask 11. The photomask 11 subjected to the light exposure has the original circuit pattern formed on a surface 11a, and through the reduction projection by the projection optics 5, the image having the circuit pattern is transferred onto the resist film on the wafer 13.

FIG. 2(a) is a schematic side view of a photomask having substantially flat surfaces, and FIG. 2(b) is a schematic side view of the photomask disposed in a substantially horizontal position, as it will be in an exposure tool. Referring to FIGS. 2(a) and 2(b), the deformation of a photomask by its weight is discussed. Suppose a photomask 66 as shown in FIG. 2(a) having a substantially flat surface 66a and the original circuit pattern formed in the central portion of the surface 66a. For example, on a 152 mm×152 mm square photomask, a certain pattern of 132 mm×104 mm could be formed in its central portion. When this photomask 66 is positioned to have the surface 66a facing downward as illustrated in FIG. 2(b), the photomask 66 is supported at peripheral portions outside the central portion so as not to damage the circuit pattern. Thus, the photomask 66 does not stay completely flat by the influence of gravity, and the surface 66a forms a convex shape, causing the circuit pattern provided on the surface 66a to be deformed and expanded. Besides such a gravity effect, the photomask surface may be deformed for various reasons. For example, when the photomask is held by vacuum clamping or electrostatic chucking, since neither the stage holding the photomask nor the photomask itself is completely flat, the photomask may be deformed due to the difference in the surface flatness between the stage and the photomask. Also, such a deformation may be caused when the photomask is mechanically clamped too hard by using, e.g., pins for fixing the photomask on its side, and stress is produced in the photomask. When the photomask 66 is deformed as described above, since the positions of the circuit elements on a deformed pattern formed on the photomask 66 are deviated from the originally designed positions, the image printed onto a resist film on the wafer by using the deformed photomask 66 will not have a desired, precise pattern. Furthermore, since the surface 66a of the photomask 66 is not parallel to the ground, an unfocused image is obtained on the resist film on the wafer. In forming a highly-integrated circuit pattern on the semiconductor wafer by using the lithography technique, even a slight reduction in the position accuracy or a small displacement of the focal point may result in a critical deficiency of the resultant circuit. More specifically, in the exposure tool using a photomask having a surface not sufficiently flat and having a peak-to-valley value of (X), the displacement (D) of the focal point in the depth of focus can be obtained by the formula, $D=X/m^2$, where (m) is the magnification of the projection lens in the exposure tool and is usually four or five times.

FIG. 3(a) is a schematic side view of a photomask according to one embodiment of the present invention, and FIG. 3(b) is a schematic side view of the photomask disposed in a substantially horizontal position, as it will be in an exposure tool. The photomask 11 has a curved surface 11a on which an original circuit pattern is to be formed. As illustrated in FIG. 3(b), when placed in the exposure tool, the photomask 11 is held by support units 20 positioned at peripheral portions of the surface 11a. The view taken from the surface 11a side is provided in FIG. 4. As an example, in FIG. 4 three support units 20 are positioned in the peripheral portions of the photomask 11. For instance, for a photomask having an area of 152 mm×152 mm and a thickness of 6.35 mm, support units made of PEEK (polyether ether ketone) may be utilized which support the pattern surface via a contact point with a diameter of 0.5 mm, and distances (D) and (d) in FIG. 4 may be 2 inches and 2 mm, respectively. The sizes of the photomask and the circuit pattern to be formed on the photomask may vary, but for a 6 inch×6 inch photomask having a thickness of 0.09-0.25 inches, for example, the size of a circuit pattern to be formed on the photomask may be 108 mm×132 mm, in which an area of 26×33 mm is exposed per exposure using the ×4 reduction exposure tool. Thus, in this example, the photomask may be supported at positions outside the 108 mm×132 mm area. Although the dimensions of the photomask and the positions of the support units may be given as above, this arrangement of the support units is a mere example, and the method of holding the photomask, the number and positions of the support units, the material and other measurements are not limited to this example. The photomask may be disposed on the stage by vacuum clamping, electrostatic chucking or mechanical clamping by using, e.g., pins for fixing the photomask to the stage.

Referring back to FIGS. 3(a) and 3(b), the structure of the photomask 11 according to the embodiment of the present invention will be further described. As stated above, the photomask 11 has the curved surface 11a on which the original pattern is to be formed. When the photomask 11 is held at its peripheral portions as shown in FIG. 3(b), the unsupported portions are slightly pulled down mainly because of their weight, but since a proper amount of a surface portion is removed and the surface 11a is originally curved as illustrated in FIG. 3(a), the surface 11a actually becomes substantially flat. In other words, according to this embodiment of the present invention, the deformation of the photomask 11 when disposed in a substantially horizontal position in the exposure tool 10 is substantially compensated, and the surface 11a having the original circuit pattern stays substantially parallel to the ground. Thus, unlike the photomask 66 of FIG. 2(b), the adverse effects caused by the deformed surface 66a, e.g., reduction in the position accuracy of the original pattern and displacement of the focal point are minimized, and therefore the originally designed pattern is more precisely transferred and formed on the wafer. As discussed above, one of the objectives of the embodiment of the present invention is to produce a photomask substrate having a substantial surface flatness in its horizontal direction when positioned in an exposure device, by considering beforehand the gravity and other causes that affect the flatness of the substrate. In the method of manufacturing a photomask substrate according to one embodiment of the present invention, as described below in more detail, the curved surface 11a is formed in the surface of the photomask 11, which device pattern will be formed on, by polishing to remove an appropriate amount of a surface portion of the substrate.

Figure 5A:
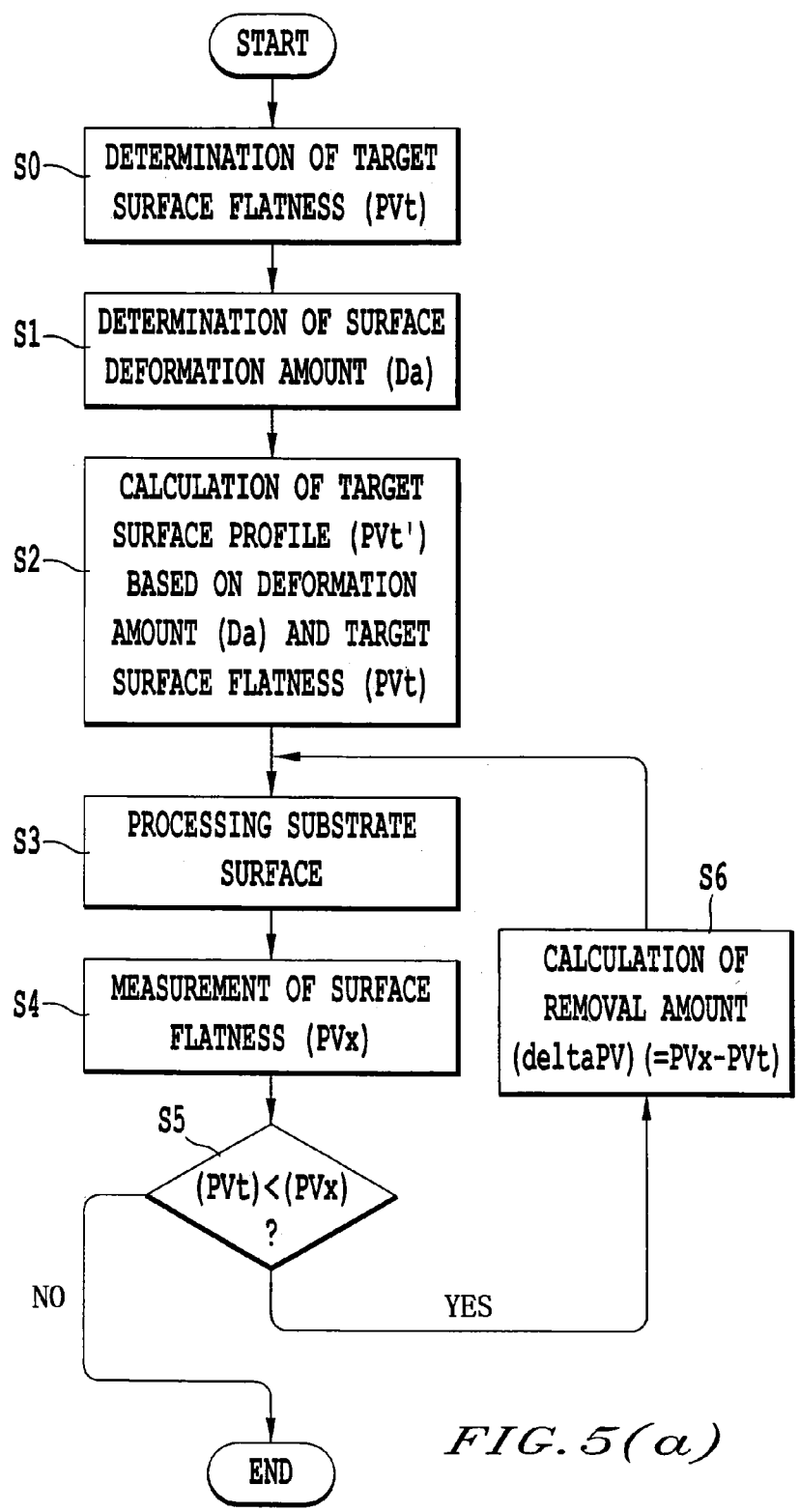
FIG. 5(a) is a flowchart showing a method of manufacturing a photomask according to one embodiment of the present invention.
Figure 5B:
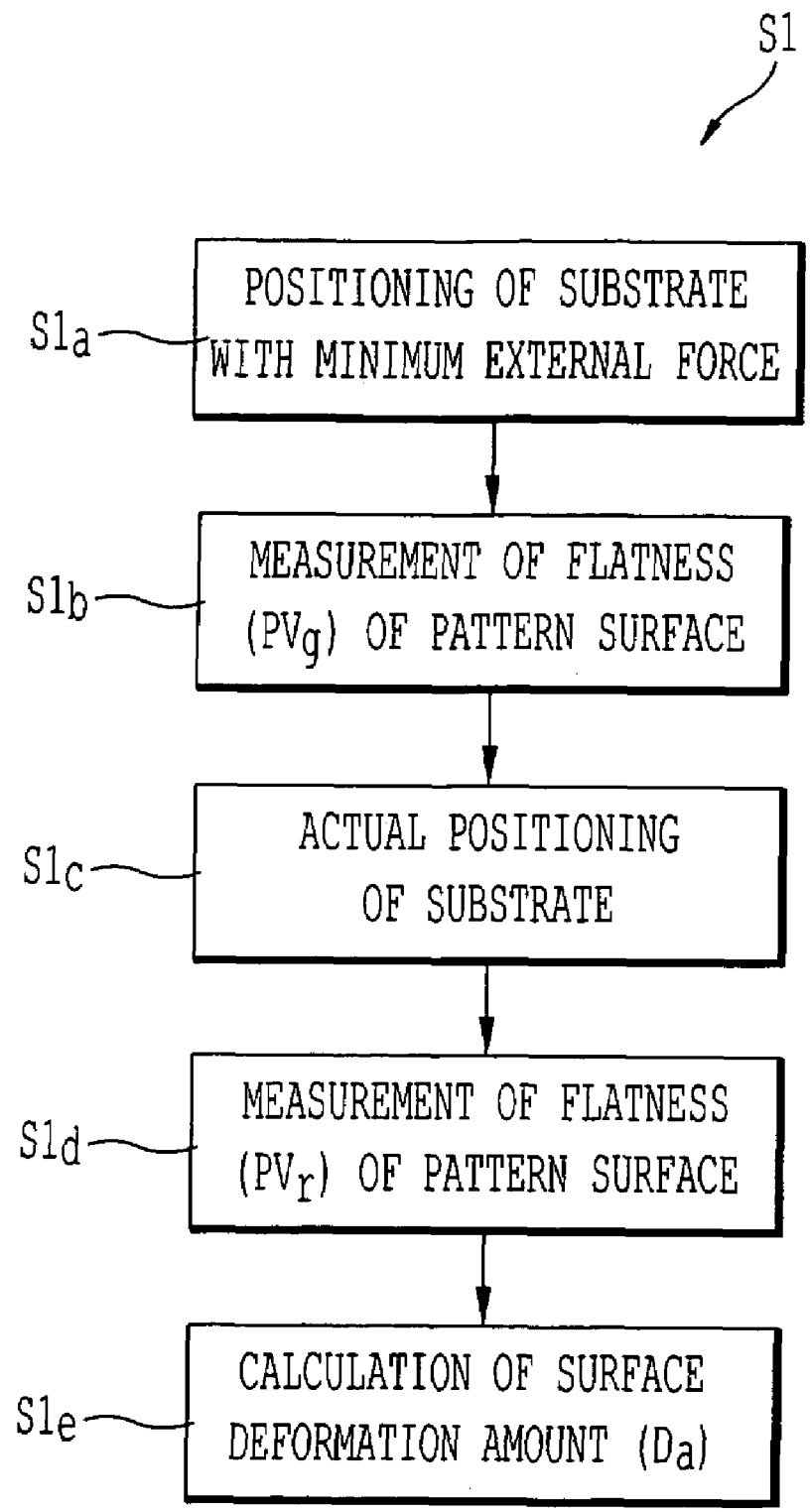
FIG. 5(b) is a partial flowchart for the step (S1) of FIG. 5(a)

FIG. 5(a) is a flowchart showing a method of manufacturing a photomask substrate according to one embodiment of the present invention, FIG. 5(b) is a partial flowchart for step (S1) of FIG. 5(a). As mentioned above, in the present embodiment, a surface 66a of FIG. 2(a) which a circuit pattern will be formed on, is polished to make the curved surface 11a as shown in FIG. 3(a). The original surface of the mask does not have to be flat before processing or polishing, and it could be curved in a convex, concave or any other form. When examining the flatness of the photomask surface, a peak-to-valley (hereinafter, "PV") value of the surface is measured, and its degree of deviation from true surface planarity is determined. According to the International Technology Roadmap for Semiconductors (ITRS) 2003, the blank flatness is defined as peak-to-valley across the 110 mm×110 mm central area image field on a 6 inch×6 inch square mask blank. The contents of the ITRS 2003 are incorporated herein by reference in their entirety.

Figure 6A:
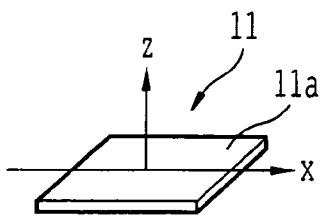
FIG. 6(a) is a schematic illustration showing x- and z-axes of a graph of FIG. 6(b)
Figure 6B:
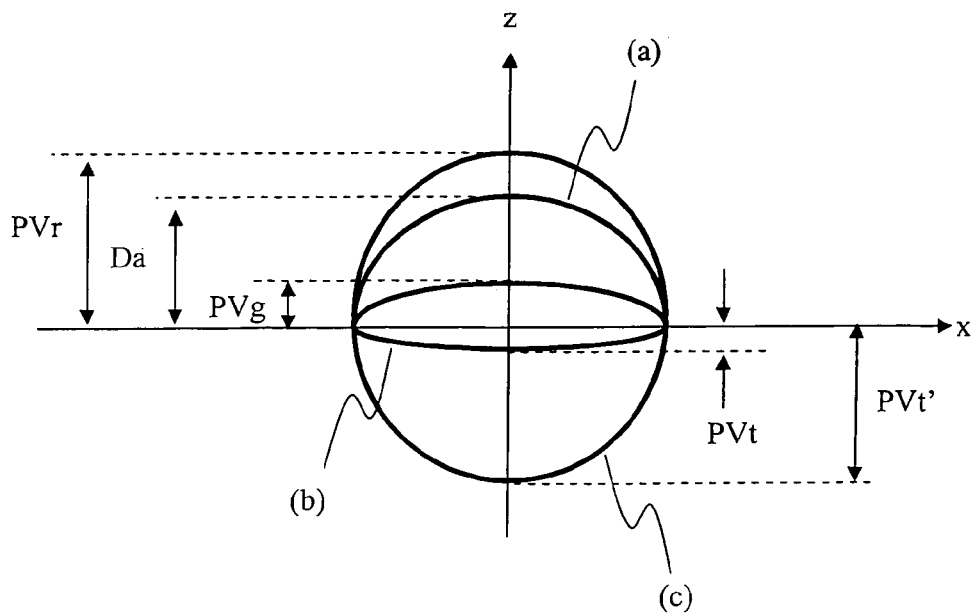
FIG. 6(b) is an x-z graph schematically illustrating the surface shapes of the photomask and the peak-to-valley values measured in the method of FIG. 5(a)

FIG. 6(a) is a schematic illustration showing the photomask 11 and directions of x- and z-axes with respect to the surface 11a. As illustrated, the x-axis is parallel to the surface 11a of the photomask 11, and the z-axis is vertical to the surface 11a, and the origin is in the center portion of the surface 11a. FIG. 6(b) is a graph showing how the values such as (PVt) and (Da) are obtained in the method of FIGS. 5(a) and 5(b). The overall flow in the method of FIG. 5(a) will be first described and then each of steps (S0)-(S6) will be explained in more detail by referring to FIGS. 5(a), 5(b), 6(a) and 6(b).

As shown in FIG. 5(a), the step (S0) is to determine a target surface flatness (PVt) of the photomask being positioned in the exposure tool during the actual use (hereinafter, referred to as "being in an actual position" and "actual positioning"). For example, in this embodiment, the photomask is positioned with the pattern surface facing downward and supported at its peripheral portion. The target flatness (PVt) may be flexibly determined depending on, e.g., the degree of integration of the circuit pattern to be formed. For example, according to the above-mentioned ITRS 2003, the target flatness of the mask blank is set to be less than 192 nm in peak-to-valley for the formation of a fine semiconductor circuit pattern having 50 nm-wide patterns. The subsequent step (S1) is to determine a deformation amount (Da) of the photomask surface in the actual positioning of the photomask. In general, there are a number of ways of positioning and holding the photomask in the exposure tool and for example, the photomask may be vertically placed and clamped so as to fix its position. However, the clamping may impose mechanical stress onto the photomask and cause the substrate to be deformed. Also, when the photomask is horizontally positioned and supported by a supporting member, it may be deformed due to its own weight. Thus, in this step (S1), such a deformation of the pattern surface due to various reasons of the photomask being in an actual position is all taken into consideration and the amount of the deformation is calculated as described later in detail. As stated above, even if the surface for the pattern formation is originally flat, the unsupported central portion is pulled downward and the surface is deformed to become a convex-like form as in FIG. 2(b). For this substrate, the amount (Da) of the surface deformation, i.e., the deviation from its planarity is obtained in the PV value in the step (S1). Subsequently, the process proceeds to the step (S2) which calculates the target surface profile (PVt'). The target surface profile (PVt') is obtained by subtracting the deformation amount (Da) from the target surface flatness (PVt). In the step (S3), the photomask surface is processed or polished to obtain the target surface profile (PVt') by removing a surface portion of the substrate in the thickness direction. Then, in the step (S4), the flatness of the surface of interest is examined by measuring its PV value (PVx) of the surface. Here, the surface flatness (PVx) can be measured upon the actual positioning. In this case, the flatness of the surface of interest results from the genuine surface flatness and from the deformation caused by the actual positioning of the substrate and then in the step (S5) it will be compared with the target PV value (PVt) defined in the step (S0). In the step (S0), a genuine flatness (PVx') of the same surface, which is the surface flatness of the substrate being vertically held to minimize an extra stress exerted onto the substrate, can also be measured to compare with the target surface profile (PVt'). The step (S5) is to determine whether to further polish the surface to produce a desired, curved surface. If the measured PV value (PVx and/or PVx') is larger than the target PV value (PVt and/or PVt'), the process goes back to the step (S3) by way of the step (S6). In the step (S6), the removal amount (delta PV) is calculated either by subtracting (PVt) from (PVx) and/or by subtracting (PVt') from (PVx'). The steps (S3)-(S6) are repeated until the measured surface roughness becomes less than the target surface roughness. For example, the steps are continued until the measured PV value (PVx) of the processed surface becomes equal to or less than the target value (PVt), or alternatively until (PVx') becomes equal to or less than (PVt'). Also, both comparisons, between (PVx) and (PVt) and between (PVx') and (PVt'), may be conducted to determine whether to conduct further processing. Further explanations for each of the steps (S1)-(S6) are provided below by referring to FIGS. 5(a), 5(b), 6(a) and 6(b).

As shown in FIG. 5(b), the step (S1) includes, e.g., steps (S1a)-(S1e) in order to obtain the surface deformation amount (Da). In the step (S1a), the photomask is positioned in a manner such that external forces such as a stress imposed onto the surface for the pattern formation are minimized. For example, the photomask may be positioned substantially vertical to the ground. Then, the flatness of the pattern surface is examined in the step (S1b). Here, as an example, by using devices such as an interferometer, a PV value (PVg) of the pattern surface is obtained. As discussed above, in the step (S1a), the mask may be positioned vertically so as to examine the genuine flatness of the substrate surface with minimum effects of gravity or any other stress caused by supporting the mask. However, the mask position is not limited to vertical as long as the surface flatness can be measured without the influence of gravity or any other factors that might affect the original flatness of the mask blank surface. Subsequently, in the step (S1c), the photomask is disposed in the actual position, i.e., positioned as it will be in the exposure tool. For example, the photomask is positioned in a substantially horizontal position with its pattern surface facing downward and being supported at its peripheral portion as illustrated in FIG. 2(b), and then the flatness of this surface is examined. When the substrate is positioned horizontally and held only at the peripheral portion, unsupported central portions of the pattern surface are pulled down due to gravity, and thus the surface forms a convex-like curve in the downward direction. Assuming that the central portion of the surface is most deviated from the planarity, the convex curve may be schematically illustrated by line (a) in the graph of FIG. 6(b), where the +z-direction indicates the protruding direction from the surface. With the pattern surface being deformed as such, in the method of this embodiment of the present invention, the PV value (PVr) of the pattern surface is measured in the step (S1d) by using devices such as an interferometer. The PV value (PVr) obtained in this step may be a positive value such as 400 nm. Then, the surface deformation amount (Da) is obtained by the equation, (Da)=(PVr)−(PVg). The aforementioned method actually performs the measurement of surface flatness, but besides such an experimental method, other methods using computer simulation and numerical analysis such as the Finite Element Method which directly estimate the deformation amount (Da) are also available.

Referring back to FIG. 5(a), the step (S2) is to determine the target surface profile (PVt') based on (PVt) and (Da) values. The value (PVt') is obtained by subtracting the deformation amount (Da) from the target surface flatness (PVt). Suppose that the targeted shape (PVt) of the pattern surface when the photomask is positioned horizontally in the exposure tool is slightly curved in a concave-like form in its side view, the surface curve may be illustrated by the line (b) in the graph of FIG. 6(b). In this graph, since a positive value means that the surface is curved in a convex-like form or protruding downward, the target flatness (PVt) in this case is set as a negative value such as −100 nm. Subsequently, a deformation amount (Da) is obtained by the equation, (Da)=(PVr)−(PVg), as illustrated by the PV value of the line (a) in the graph of FIG. 6(b), and then the target surface profile (PVt') which corresponds to the line (c) is calculated by the equation, (PVt')=(PVt)−(Da). Thus, for example, if the deformation amount (Da) is 400 nm and the target value (PVt) is −100 nm, the value (PVt') is obtained as −500 nm, meaning that the surface for the pattern formation of the photomask should be processed to have a concave profile with a peak-to-valley of 500 nm.

In the step (S3) of FIG. 5(a), the mask surface is processed to obtain the target surface profile (PVt'). In the method of this embodiment, the surface is polished to remove a surface portion of the photomask. Here, the global wet polishing can be used with using polishing slurry containing, e.g., silica particles and cerium oxide particles, and wet polishing of portions of the surface by using a polishing pad which is made of, e.g., polyurethane foam and larger than the surface and using abrasive grains. This polishing method is suitable for obtaining a surface with a simple curved profile such as a convex and/or a concave shape. A concave and convex curved surface can be controlled by adjusting the hardness of the polishing pad and/or by adjusting the polishing pressure. In addition to this method, a local polishing method, which polishes the local surface of the substrate, can be used. The examples of the local polishing method are listed as wet polishing of the entire surface by using a polishing pad smaller than the surface size and using abrasive grains, Chemical Vaporization Machining Method utilizing plasma of fluoride compounds or other materials, Magnetorheological Finishing using magnetic fluids and cerium oxide and polishing utilizing the gas cluster ion beam (GCIB) such as the argon beam. These local polishing methods are suitable to correct the surface profile obtained by other polishing methods and to obtain a complicated surface profile. In Example 1 described below, a polishing pad larger than the polishing surface is used to polish the entire surface of a mask. Japanese Unexamined Patent Publications 10-337638 and 8-120470 disclose the Chemical Vaporization Machining Method and the method using the GCIB, respectively, and *Proceedings of SPIE*, 5533: 99-107 (2004) describes the Magnetorheological Finishing by QED Technologies. Also, Japanese Unexamined Patent Publications 10-329012 and 10-286771 disclose a wet polishing method which utilizes a polishing pad smaller than the surface. The contents of the Japanese Unexamined Patent Publications 10-337638, 8-120470, 10-329012 and 10-286771, and *Proceedings of SPIE*, 5533: 99-107 (2004) are incorporated herein by reference in their entirety.

The step (S4) is to examine the flatness of the processed surface of the photomask which is disposed, as it will be in the exposure tool, in a substantially horizontal position with the processed surface facing downward. In the method of the present embodiment, the PV value (PVx) of the polished surface is measured by using devices such as an interferometer. In this condition, the pattern surface is desired to be substantially flat, and thus a smaller (PVx) is preferred.

In the step (S5), it is determined whether the surface is further polished or not. For example, if the target flatness (PVt) is −200 nm and the measured value (PVx) is −500 nm, the surface portion is removed in the removal amount of delta PV to the thickness direction, which is determined in the step (S6) as −300 nm in this example. That is, the surface requires further processing in the amount of 300 nm in its thickness direction, and methods such as the local polishing method discussed above are preferable to conduct fine, accurate processing and obtain a target surface profile. As stated above, the steps (S3)-(S6) are repeated until the measured flatness value (PVx) becomes equal to or less than the target value (PVt). In the above exemplary method, the calculations are performed based on the above-mentioned equations, but the equations may be modified to, e.g., incorporate more variables or factors as appropriate. After the surface polishing for the photomask is completed, a predetermined circuit pattern is formed on that surface. For example, a circuit pattern may be formed by first uniformly forming a film comprised of light shielding material such as Cr or a phase-shifting film comprised of MoSi, MoSiN, etc. on the pattern formation surface of a glass substrate, applying a resist onto the surface, forming a desired pattern on the resist by using electron beam or laser light, developing the pattern, and then etching the substrate. While forming the pattern onto the photomask as such, it is preferable to position the photomask as it will be positioned on a mask holder during the actual use in the exposure tool.

Figure 7:
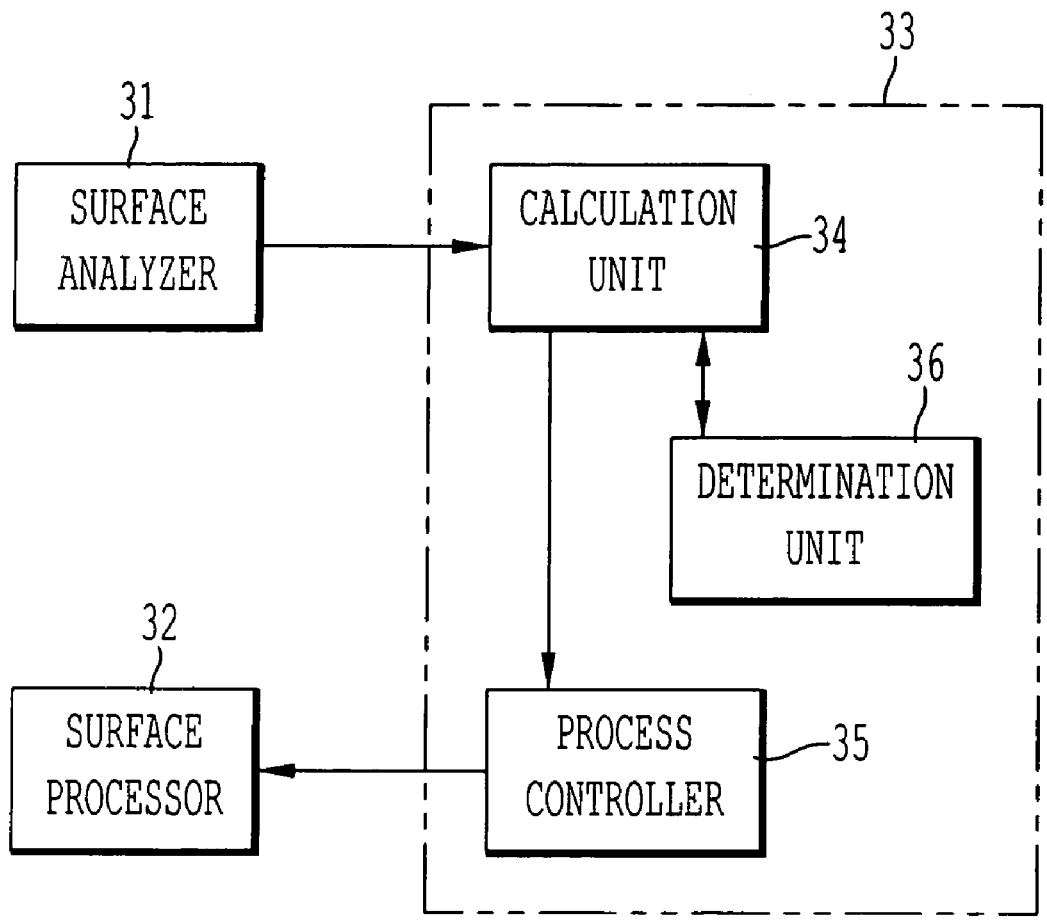
FIG. 7 is a schematic block diagram of a photomask processing device according to one embodiment of the present invention.

FIG. 7 is a schematic block diagram of a photomask processing device according to one embodiment of the present invention. The processing of the photomask following the aforementioned steps (S0)-(S6) may be performed in a photomask processing device 30 as shown in FIG. 7. The photomask processing device 30 includes a surface analyzer 31, a surface processor 32 and a controller 33. The surface analyzer 31 is configured to measure a surface flatness of a photomask. In the above method of FIGS. 5(a) and 5(b), the steps for examining the surface flatness, including the steps (S1b), (S1d) and (S4), may be performed by the surface analyzer 31. The surface analyzer 31 may include any devices capable of measuring the flatness of the mask surface such as interferometers. The surface processor 32 is configured to process the surface of the photomask so as to remove a surface portion and form a desired shape. The surface processor 32 may perform the step (S3) of FIG. 5(a). The surface processor 32 may include any polishing devices including devices that polish the sample surface by using polishing pads, abrasive particles, plasma, magnetic fluids, polishing slurry, gas cluster ion beam, etc. The controller 33 includes a calculation unit 34, a process controller 35 and a determination unit 36. The calculation unit 34 is configured to calculate a target surface profile of the surface portion of the substrate based on the flatness measured by the surface analyzer 31. The process controller 35 is configured to control the surface processor 32 to remove the surface portion to obtain the target surface profile calculated by the calculation unit 34. In the method of FIG. 5(a), the calculation steps such as the step (S2) may be performed in the calculation unit 34, and based on the results, the process controller 35 controls the surface processor 32 accordingly. The determination unit 36 is configured to determine whether the flatness measured by the surface analyzer 31 reaches a target flatness of the surface. The step (S5) in the method of FIG. 5(a) may be performed by the determination unit 36. Although the calculation unit 34, the process controller 35 and the determination unit 36 are shown as separate units in FIG. 7, these units may be realized in a single module which performs the proper tasks or any number of modules.

Figure 8:
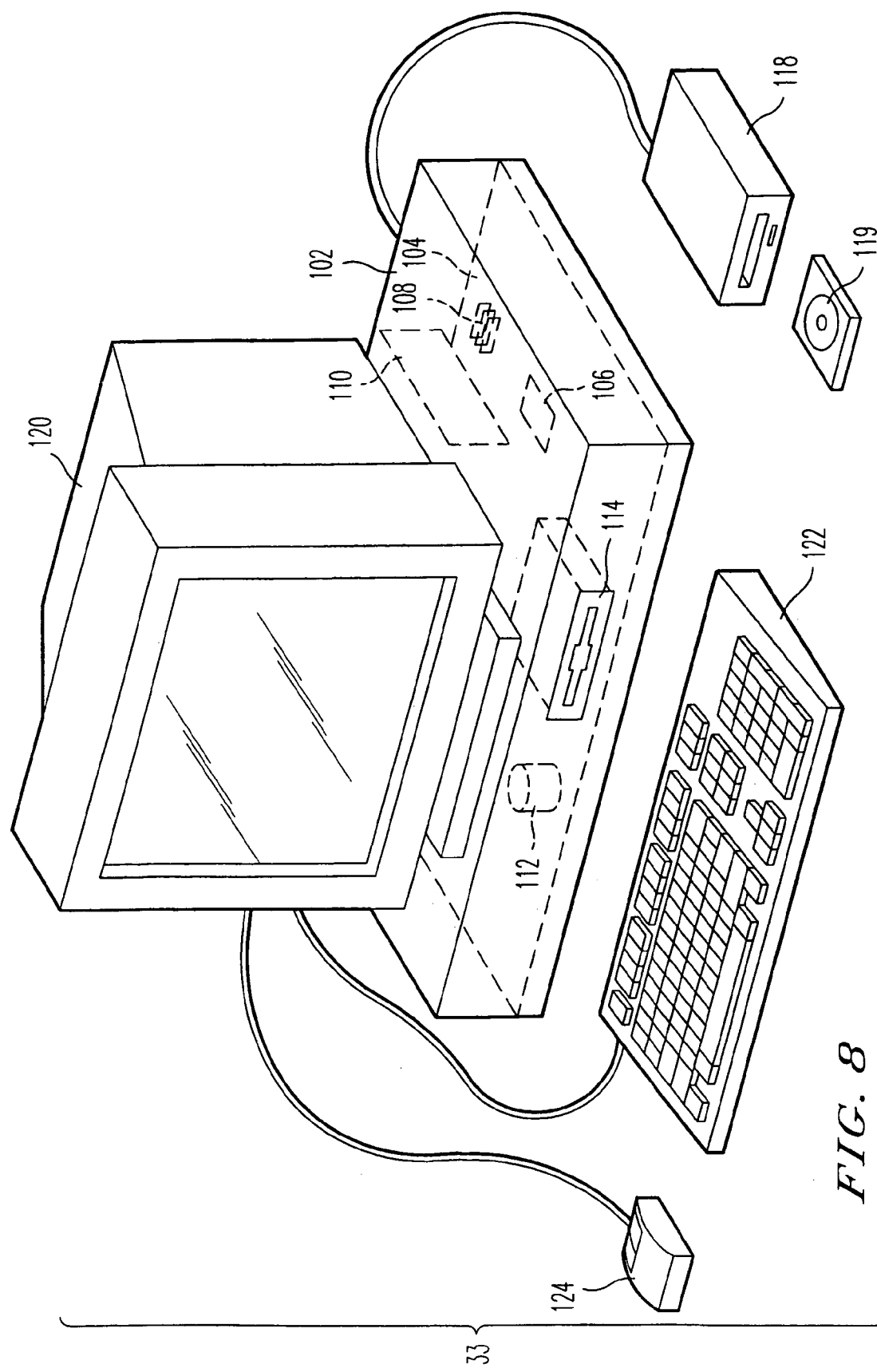
FIG. 8 is a schematic illustration of a controller of the photomask processing device.

FIG. 8 is a schematic illustration of the controller 33. In this embodiment, the controller 33 includes, for example, a computer system. The computer system 33 implements the method of the present embodiment according to the invention, wherein the computer housing 102 houses a motherboard 104 which contains a CPU 106, memory 108 (e.g., DRAM, ROM, EPROM, EEPROM, SRAM, SDRAM, and Flash RAM), and other optional special purpose logic devices (e.g., ASICs) or configurable logic devices (e.g., GAL and reprogrammable FPGA). The computer system 33 also includes plural input devices, (e.g., a keyboard 122 and mouse 124), and a display card 110 for controlling monitor 120. In addition, the computer system 100 further includes a floppy disk drive 114; other removable media devices (e.g., compact disc 119, tape, and removable magneto-optical media (not shown)); and a hard disk 112, or other fixed, high density media drives, connected using an appropriate device bus (e.g., a SCSI bus, an Enhanced IDE bus, or a Ultra DMA bus). Also connected to the same device bus or another device bus, the computer system 33 may additionally include a compact disc reader 118, a compact disc reader/writer unit (not shown) or a compact disc jukebox (not shown). Although compact disc 119 is shown in a CD caddy, the compact disc 119 can be inserted directly into CD-ROM drives which do not require caddies.

As stated above, the system includes at least one computer readable medium. Examples of computer readable media are compact discs 119, hard disks 112, floppy disks, tape, magneto-optical disks, PROMs (EPROM, EEPROM, Flash EPROM), DRAM, SRAM, SDRAM, etc. Stored on any one or on a combination of computer readable media, the present embodiment of the invention includes software for controlling both the hardware of the computer 100 and for enabling the computer 100 to interact with a human user. Such software may include, but is not limited to, device drivers, operating systems and user applications, such as development tools. The computer code devices of the present embodiment of the invention can be any interpreted or executable code mechanism, including but not limited to scripts, interpreters, dynamic link libraries, Java classes, and complete executable programs.

As discussed above, the photomask according to one embodiment of the present invention has a surface including a portion on which a predetermined pattern is to be formed and a peripheral portion outside the portion, and the surface is a curved surface formed by removing a surface portion in an appropriate amount so that, when the photomask is disposed in a substantially horizontal position in an exposure tool and supported only at its peripheral portion, the surface is deformed to be substantially parallel to the ground mainly because of the gravity effect. The amount of the surface portion to be removed is more precisely determined based on the flatness of the surface which is measured for the photomask being disposed in a substantially horizontal position as it will be during its actual use. Also, by setting a target flatness of the surface and repeating the surface processing until the measured surface flatness reaches the target flatness, a desired curved shape of the pattern surface is produced with an excellent accuracy, and by initially designing the surface shape of the photomask as such in consideration of the gravity-induced surface deformation and deformation produced by other causes during its actual use, a substantial flatness for the pattern surface of the photomask when disposed in the exposure tool horizontally is achieved with a higher accuracy, and the original circuit pattern on the photomask is not deformed because of the mask deformation by its weight or other causes and maintains the originally-designed pattern. As a result, the image transferred to the wafer by using the photomask according to the embodiment of the present invention is more focused and clear, and has a desired pattern with improved contrast and position accuracy.

According to one embodiment of the present invention, a method of manufacturing a photomask includes providing a substrate having a surface including a portion on which a predetermined pattern is to be formed and a peripheral portion outside the portion, disposing the substrate in a substantially horizontal position, the substrate having the surface facing downward and being supported at the peripheral portion to measure a flatness of the substrate surface under an external force of gravity, disposing the substrate in a substantially vertical position and being supported at the peripheral portion to measure a flatness of the substrate surface without a gravity force, obtaining a deformation amount of the substrate surface due to an external force of gravity by comparing the two measured flatnesses, and calculating a target surface profile of the substrate based on the deformation amount so as to make the substrate surface flat as much as possible upon holding the substrate in a substantially horizontal position, and processing the surface so as to obtain the target surface profile by removing the surface portion of the substrate in a thickness direction. By using such a photomask substrate produced by the manufacturing method according to the embodiment of the present invention, the substrate disposed in the exposure device achieves a substantially flat surface in the horizontal direction, and thus the pattern on the photomask is more accurately transferred to the photoresist film coated on the wafer.

Also, a method of manufacturing a photomask according to one embodiment of the present invention includes providing a substrate having a surface on which a predetermined pattern is to be formed, positioning the substrate in an exposure tool and obtaining a deformation amount of the substrate surface due to an external force imposed on the substrate, calculating a target surface profile of the substrate based on the deformation amount so as to make the substrate surface flat upon positioning the substrate in an exposure tool, and processing the surface of the substrate so as to obtain the desired surface profile.

Furthermore, according to one embodiment of the present invention, a photomask has a surface including a portion on which a predetermined pattern is to be formed and a peripheral portion outside the portion. The surface is a curved surface formed by removing a surface portion of the substrate in a thickness direction to obtain the target surface profile. The target surface profile is calculated based on the deformation amount of the substrate surface as well as the target flatness of the surface when the substrate is disposed in a substantially horizontal position and the surface faces downward and is supported at the peripheral portion.

Additionally, according to one embodiment of the present invention, a photomask processing device includes a surface analyzer, a calculation unit, a surface processor and a process controller. The surface includes a portion on which a predetermined pattern is to be formed and a peripheral portion outside the portion. The surface analyzer is configured to measure a deformation amount of the substrate surface by measuring a flatness of the substrate surface when the substrate is held with minimizing any external stress as well as when the substrate is disposed in a substantially horizontal position and supported at the peripheral portion, and has the surface facing downward. The calculation unit is configured to calculate a target surface profile of the substrate based on the flatness measured by the surface analyzer. The surface processor is configured to process the surface so as to remove the surface portion of the substrate and to obtain the desired surface profile. The process controller is configured to control the surface processor to remove the surface portion.

Still additionally, according to one embodiment of the present invention, there is provided a computer readable media for controlling a computer to perform providing a substrate having a surface including a portion on which a predetermined pattern is to be formed and a peripheral portion outside the portion, obtaining a deformation amount of the substrate surface by analyzing the external force applied to the substrate which is supported at a peripheral portion, calculating target surface profile of the substrate based on the surface deformation amount, and processing the surface so as to obtain the desired surface profile of the substrate by removing the surface portion of the substrate in a thickness direction.

The aforementioned method of manufacturing a photomask according to one embodiment of the present invention will be further described based on the following Example 1.

EXAMPLE 1

A synthetic quartz glass is produced from $SiCl_4$ by the flame hydrolysis method and shaped into a substrate having the area of 6 inch×6 inch and the thickness of about 6.6 mm is obtained. The substrate is then disposed in a grinding machine, e.g., a lapping and polishing machine (12B) manufactured by HAMAI Co., Ltd., and its top and bottom surfaces are entirely polished by using SiC abrasive particles having an average particle size of 10-20 μm. Both surfaces are then polished by using $Al_2O_3$ abrasives having an average particle size of 5-10 μm to obtain a root mean square (RMS) surface roughness of about 0.5-0.7 μm. Subsequently, two polishing pads made of polyurethane differing in hardness are attached to the top and bottom surfaces, and the substrate is placed in a polishing machine, e.g., a lapping and polishing machine (12B) manufactured by HAMAI Co., Ltd., which utilizes cerium oxide abrasive particles having an 1-2 μm average particle size, and the two surfaces are each polished in the amount of about 200 μm in the thickness direction. Here, among the two surfaces, the surface on which a pattern is later formed is polished with a softer polishing pad, e.g., MHC14A having Shore Hardness of 75 manufactured by Rodel Nitta, and the polishing is controlled so as to obtain a convex-like surface. On the other hand, the opposite surface is polished with a harder polishing pad, e.g., a Rodel Nitta polishing pad MHC15A having Shore Hardness of 85, and the polishing is controlled to obtain a concave-like surface. The polished substrate is then used to obtain a value of (Da) as discussed below.

Figure 4:
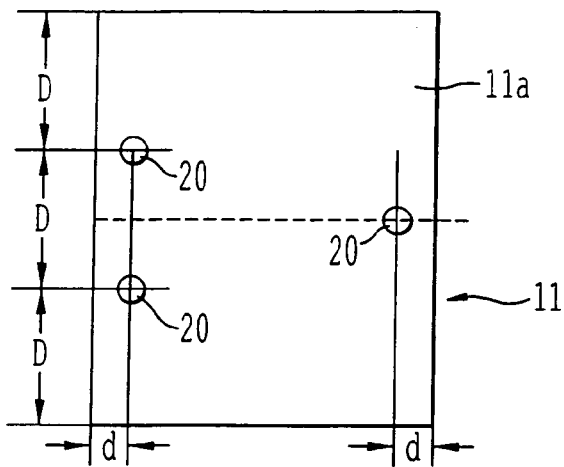
FIG. 4 is a schematic plan view taken from the surface 11a side of the photomask of FIG. 3(b)

When a substrate is actually used in an exposure tool, the substrate may be supported in a number of ways, but in this example, a method of horizontally supporting a substrate as shown in FIGS. 3(b) and 4 is utilized. In this case, the substrate is deformed mainly because of the gravity. Therefore, the (Da) value of the above-mentioned polished substrate is obtained by measuring the flatness of the pattern surface while horizontally placing the substrate in the exposure tool for the actual use and by measuring the flatness of the pattern surface of the same substrate while vertically holding it such that an extra stress exerted onto the substrate is minimized, for example, by a method discussed in Japanese Patent Application 2004-316788, and then calculating the difference of the two flatness measurements. As a result, the deformation amount, i.e., the difference in the measured flatness values, is 0.50 μm as shown in Table 1, and the surface is deformed in a convex form.

TABLE 1

|  | Surface shape | Flatness |
|---|---|---|
| Substrate disposed horizontally | Convex | 0.99 μm (PVr) |
| Substrate disposed vertically | Convex | 0.49 μm (PVg) |
| Deformation amount | Convex | 0.50 μm (Da) |

The target surface flatness (PVt) is set as −0.25 μm (0.25 μm in the concave form), and the target substrate shape (PVt') is obtained as −0.75 μm in this example, based on the formula, (PVt')=(PVt)−(Da), which means that the surface is to be processed in the amount of 0.75 μm in the thickness direction to form a concave shape.

Subsequently, a new substrate having an RMS surface roughness of about 0.5-0.7 μm is prepared by the same method as above. Two polishing pads made of polyurethane having different hardness are attached to its top and bottom surfaces, the substrate is disposed in a polishing device such as a lap plate grinding device manufactured by HAMAI Co., Ltd., which uses cerium oxide abrasive particles having an 1-2 μm average particle size, and the top and bottom surfaces are entirely polished in the amount of about 120 μm in the thickness direction. This time, among the two surfaces, the surface on which the pattern is later formed is polished with a harder polishing pad, e.g., a Rodel Nitta polishing pad MHC15A having Shore Hardness of 85, and the polishing is controlled to obtain a concave-like surface within a flatness of 0.75 μm in peak-to-valley in accordance with the (PVt') value obtained above. On the other hand, the opposite surface is polished with a softer polishing pad, e.g., MHC14A having Shore Hardness of 75 manufactured by Rodel Nitta, and the polishing is controlled so as to obtain a convex-like surface. As a result, a 6 inch×6 inch substrate having a thickness of 6.35 mm and an RMS surface roughness of 0.2 μm is obtained. Then, this substrate is horizontally disposed in an exposure tool for the actual use, and the flatness of the pattern surface is measured. As a result, the surface is a concave form and its flatness PV value (PVx) is obtained as −0.24 μm in the thickness direction, which means that the surface is less rough than the target surface profile expressed by the (PVt) value of −0.25 μm. Accordingly, the processing of the substrate is completed. For comparison, the flatness of the same surface of the substrate being vertically held such that the stress imposed on the substrate is minimized is measured and obtained as −0.69 μm (0.69 μm in a concave form) in the thickness direction. The results are shown in Table 2.

TABLE 2

|  | Surface shape | Flatness |
| --- | --- | --- |
| Substrate disposed horizontally | Concave | 0.24 μm |
| Substrate disposed vertically | Concave | 0.69 μm |
| Difference | Convex | 0.45 μm |

As indicated above, even if the pattern surface itself has a smaller flatness as in the case of the substrate of Table 1, the flatness value of the same surface measured for the substrate being actually disposed in the exposure tool shows that the surface is less flat, and thus the surface requires pre-processing or pre-shaping in consideration of the deformation caused by the positioning of the substrate in the actual use.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a photomask substrate by a processing device, comprising:
   providing a substrate having a surface including a portion on which a predetermined pattern is to be formed and a peripheral portion outside the portion;
   disposing the substrate in a substantially horizontal position, the substrate having the surface facing downward and being supported at the peripheral portion;
   determining an amount of deformation of the surface caused by an external force exerted on the substrate while being supported at the peripheral portion and being disposed in the substantially horizontal position;
   calculating a target surface profile of the surface, based on the amount of deformation and a target flatness of the surface of the substrate being disposed in the substantially horizontal position; and
   removing a surface portion of the substrate so as to obtain the target surface profile.

2. The method of claim 1, wherein the external force includes gravity.

3. The method of claim 1, further comprising:
   measuring a resultant flatness of the surface after the removing; and
   determining whether the resultant flatness reaches the target flatness,
   wherein an amount of the removing is recalculated based on the resultant flatness and the target flatness, if it is determined that the resultant flatness does not reach the target flatness.

4. The method of claim 1, further comprising:
   disposing the substrate in a position such that the surface is substantially vertical; and
   measuring an original flatness of the surface being disposed in the position,
   wherein the calculating comprises calculating the amount of the deformation based on the original flatness of the surface.

5. The method of claim 1, wherein the removing comprises polishing the surface by using a polishing pad and abrasive particles.

6. The method of claim 1, wherein the removing comprises polishing the surface by using magnetic fluid.

7. The method of claim 1, wherein the removing comprises polishing the surface by using a gas cluster ion beam.

8. The method of claim 1, wherein the removing comprises polishing the surface by using polishing slurry containing silica particles and cerium oxide particles.

9. A method of manufacturing a photomask substrate by a processing device, comprising:
   providing a substrate having a surface on which a predetermined pattern is to be formed;
   positioning the substrate in an exposure tool so as to obtain an amount of deformation of the surface due to an external force imposed on the substrate while the substrate is being disposed in a substantially horizontal position, supported at a peripheral portion of the surface and having the surface facing downward;
   calculating a target profile of the surface, based on the amount of deformation and a target flatness of the surface; and
   processing the surface of the substrate to obtain the target flatness when the substrate is positioned in the exposure tool.

10. The method of claim 9, wherein the external force includes a stress caused by holding the substrate.

11. The method of claim 9, wherein the external force includes the gravity.

12. A photomask substrate comprising a surface having a portion on which a predetermined pattern is to be formed and a peripheral portion outside the portion, the surface being a curved surface formed by removing a surface portion of the substrate by a processing device to obtain a target surface profile, the target surface profile being calculated based on a flatness of the surface measured when the substrate is disposed in a substantially horizontal position and supported at the peripheral portion, and the surface faces downward.

13. The photomask substrate of claim 12, wherein the target surface profile is calculated based on a deformation amount and a target flatness of the surface of the substrate being disposed in the substantially horizontal position.

14. A photomask substrate processing device comprising:
   a surface analyzer configured to measure a flatness of a surface of a substrate while the substrate is being disposed in a substantially horizontal position, supported at a peripheral portion of the surface and having the surface facing downward, the surface including a portion on which a predetermined pattern is to be formed, the peripheral portion being outside the portion;
   a calculation unit configured to calculate a target surface profile of the surface of the substrate based on the flatness measured by the surface analyzer;
   a surface processor configured to process the surface so as to remove a surface portion of the substrate; and
   a process controller configured to control the surface processor to remove the surface portion so as to obtain the target surface profile calculated by the calculation unit.

15. The photomask substrate processing device of claim 14, further comprising a determination unit configured to determine whether the flatness measured by the surface analyzer reaches a target flatness of the surface.

16. The photomask substrate processing device of claim 15, wherein the calculation unit is configured to recalculate a removal amount of the surface of the substrate processed by the surface processor, based on the flatness measured by the surface analyzer and the target flatness, if the determination unit determines that the flatness of the substrate processed by the surface processor does not reach the target flatness.

17. A computer readable media encoded with a computer program comprising instructions for controlling a computer to perform:

providing a substrate having a surface including a portion on which a predetermined pattern is to be formed and a peripheral portion outside the portion;

disposing the substrate in a substantially horizontal position, the substrate having the surface facing downward and being supported at the peripheral portion;

measuring a flatness of the surface of the substrate while being supported at the peripheral portion and being disposed in the substantially horizontal position;

calculating a deformation amount and a desired surface profile of a surface portion of the substrate based on the flatness; and processing the surface so as to remove the surface portion of the substrate and obtain the desired surface profile.

\* \* \* \* \*